(12) United States Patent
Kuwajima et al.

(10) Patent No.: US 9,097,919 B2
(45) Date of Patent: *Aug. 4, 2015

(54) DISPLAY DEVICE

(71) Applicants: Japan Display Inc, Tokyo (JP);
Panasonic Liquid Crystal Display Co., Ltd., Hyogo-ken (JP)

(72) Inventors: Yuka Kuwajima, Mobara (JP); Eiji Oohira, Mobara (JP)

(73) Assignees: JAPAN DISPLAY INC., Tokyo (JP); PANASONIC LIQUID CRYSTAL DISPLAY CO., LTD., Hyogo-Ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/013,413

(22) Filed: Aug. 29, 2013

(65) Prior Publication Data
US 2013/0343021 A1 Dec. 26, 2013

Related U.S. Application Data

(63) Continuation of application No. 12/572,367, filed on Oct. 2, 2009, now Pat. No. 8,531,411.

(30) Foreign Application Priority Data

Oct. 2, 2008 (JP) ................................ 2008-257716

(51) Int. Cl.
*G06F 3/041* (2006.01)
*G02F 1/13* (2006.01)
(Continued)

(52) U.S. Cl.
CPC .......... *G02F 1/1309* (2013.01); *G02F 1/13338* (2013.01); *G02F 1/13452* (2013.01); *G06F 3/041* (2013.01); *H05K 1/118* (2013.01); *H05K 1/147* (2013.01)

(58) Field of Classification Search
CPC ............. H01B 7/08; G06F 1/18; G06F 3/041; H05K 1/189; H05K 2201/2009; H05K 1/118; H05K 1/147; G02F 1/1309; G02F 1/13338; G02F 1/13452
USPC ........ 361/749; 345/173, 174, 104; 178/18.01, 178/18.03
See application file for complete search history.

(56) References Cited

U.S. PATENT DOCUMENTS

| 4,026,011 A | 5/1977 | Walton |
| 5,250,758 A | 10/1993 | Fjelstad et al. |

(Continued)

FOREIGN PATENT DOCUMENTS

JP 2005-038231 2/2005

*Primary Examiner* — Lun-Yi Lao
*Assistant Examiner* — Kelly B Hegarty
(74) *Attorney, Agent, or Firm* — Lowe Hauptman & Ham, LLP

(57) ABSTRACT

A display device includes a display panel, a first film-like printed circuit board including a first terminal portion, the first film-like printed circuit board extending from one side of the display panel in a direction away from the display panel, a touch panel provided so as to be opposed to the display panel, and a second film-like printed circuit board including a second terminal portion, the second film-like printed circuit board extending from one side of the touch panel in the direction away from the display panel, the one side of the touch panel corresponding to a side parallel with and adjacent to the one side of the display panel. The first terminal portion and the second terminal portion are provided so that a connecting direction of the first or second terminal portions is different from a connecting direction of the second or first terminal portions.

4 Claims, 6 Drawing Sheets

(51) Int. Cl.
*G02F 1/1333* (2006.01)
*G02F 1/1345* (2006.01)
*H05K 1/11* (2006.01)
*H05K 1/14* (2006.01)

(56) References Cited

U.S. PATENT DOCUMENTS

| | | | |
|---|---|---|---|
| 5,541,788 A | 7/1996 | Ishida et al. |
| 5,737,053 A | 4/1998 | Yomogihara et al. |
| 6,116,930 A | 9/2000 | Sakata |
| 6,153,832 A | 11/2000 | Gaarder |
| 7,345,887 B2 | 3/2008 | Sudo et al. |
| 7,458,833 B2 | 12/2008 | Ha et al. |
| 7,586,556 B2 | 9/2009 | You et al. |
| 7,652,890 B2 | 1/2010 | Ohsawa et al. |
| 7,728,918 B2 | 6/2010 | Sakurai |
| 7,808,576 B2 | 10/2010 | Takahashi et al. |
| 8,081,285 B2 | 12/2011 | Yumoto et al. |
| 8,134,676 B2 | 3/2012 | Shim |
| 8,144,284 B2 | 3/2012 | Itaya |
| 8,149,371 B2 | 4/2012 | Oohira |
| 2002/0054261 A1 | 5/2002 | Sekiguchi |
| 2002/0075660 A1 | 6/2002 | Samant et al. |
| 2003/0095389 A1 | 5/2003 | Samant et al. |
| 2005/0099402 A1 | 5/2005 | Nakanishi et al. |
| 2008/0129927 A1 | 6/2008 | Hamada et al. |
| 2008/0137275 A1 | 6/2008 | Tada |
| 2008/0170172 A1 | 7/2008 | Okuda |
| 2010/0051326 A1 | 3/2010 | Sagisaka |
| 2010/0079387 A1 | 4/2010 | Rosenblatt et al. |
| 2010/0085326 A1 | 4/2010 | Anno |
| 2010/0142161 A1 | 6/2010 | Garnier |
| 2010/0295800 A1 | 11/2010 | Kuo |
| 2011/0193799 A1 | 8/2011 | Jun et al. |
| 2011/0261541 A1 | 10/2011 | Ogawa et al. |

DISPLAY DEVICE

CROSS-REFERENCE TO RELATED APPLICATION

This application is a continuation of U.S. application Ser. No. 12/572,367, filed Oct. 2, 2009, now U.S. Pat. No. 8,531,411, the contents of which are incorporated herein by reference.

The present application claims priority from Japanese application JP2008-257716 filed on Oct. 2, 2008, the content of which is hereby incorporated by reference into this application.

BACKGROUND OF THE INVENTION

1. Field of the Invention

The present invention relates to a display device.

2. Description of the Related Art

Recently, a module formed by attaching a touch panel to a display panel including a liquid crystal display panel (touch-panel attached display module) has become widespread. In such a module described above, respective panels are attached with printed circuit boards (for example, flexible printed circuit boards FPCs), and terminal portions provided on the printed circuit boards are connected to other control substrates.

In the touch-panel attached display module for use in a compact device such as a mobile phone, the printed circuit boards are required to be respectively attached with one side of the display panel constituting the display module, such as a liquid crystal display panel, and with one side of the touch panel which is positioned on the same side of the one side of the display panel. In addition, on each of the printed circuit boards, there is provided the terminal portion having terminals aligned therein in parallel with the above-mentioned sides. Each of the terminal portions is connected to a connector corresponding thereto. FIG. 9 is a plan view illustrating an example of the touch-panel attached display module. A touch panel and a display panel are provided below a front window FW. A flexible printed circuit board for touch panel TFPC extends from the touch panel while a flexible printed circuit board for display panel DFPC extends from the display panel. A terminal portion for display panel DTE is disposed on an end of the flexible printed circuit board for display panel DFPC while a terminal portion for touch panel TTE is disposed on an end of the flexible printed circuit board for touch panel TFPC. FIG. 10 is a partial enlarged view of a vicinity of the flexible printed circuit boards DFPC and TFPC illustrated in FIG. 9. An alignment direction of the terminals included in the terminal portion for display panel DTE and an alignment direction of the terminals included in the terminal portion for touch panel TTE are parallel with each other.

Meanwhile, test connectors for the display panel and the touch panel are desired to be large in size because the test connectors are required to have high durability and performance capable of preventing scratches onto components. However, when large-sized connectors are employed, there arises a problem that the connectors interfere with each other. An example of this case is described below. FIG. 11 is a view illustrating an example of a positional relation between test connectors DCN and TCN in a case where the test connectors DCN and TCN are to be respectively connected to the terminal portion for display panel DTE and the terminal portion for touch panel TTE illustrated in FIG. 10. In FIG. 11, the test connector DCN connected to the terminal portion for display panel DTE is illustrated by a solid line while the test connector TCN to be connected to the terminal portion for touch panel TTE is illustrated by a chain double-dashed line. The test connectors DCN and TCN each have so large width in the alignment direction of the terminals that a clearance cannot be secured therebetween, which results in interference between the test connectors DCN and TCN.

SUMMARY OF THE INVENTION

The present invention has been made in view of the above-mentioned problem, and therefore has an object of providing a display device in which test connectors are prevented from interfering with each other.

Of aspects of the present invention disclosed by the subject application, a brief outline of representative aspects is described as follows.

The present invention provides a display device including: a rectangular display panel; a first film-like printed circuit board including a first terminal portion to which a connector is to be connected, the first film-like printed circuit board extending from one side of the rectangular display panel in a direction orthogonal to the one side of the rectangular display panel; a rectangular touch panel provided so as to be opposed to the rectangular display panel; and a second film-like printed circuit board including a second terminal portion to which a connector is to be connected, the second film-like printed circuit board extending from one side of the rectangular touch panel in the direction orthogonal to the one side of the rectangular display panel, the one side of the rectangular touch panel corresponding to a side parallel with and adjacent to the one side of the rectangular display panel, the first terminal portion and the second terminal portion being provided so that a connecting direction of one of the first terminal portion and the second terminal portion is different from a connecting direction of another of the first terminal portion and the second terminal portion.

Further, according to one aspect of the present invention, the first terminal portion and the second terminal portion may be positioned between two lines extending from two parallel sides connecting with both ends of the one side of the rectangular display panel.

Further, according to another aspect of the present invention, the connecting direction of the one of the first terminal portion and the second terminal portion may be a direction defined by inclining the direction orthogonal to the one side of the rectangular display panel toward one end of the one side of the rectangular display panel.

Further, according to still another aspect of the present invention, the connecting direction of the another of the first terminal portion and the second terminal portion may be the direction orthogonal to the one side of the rectangular display panel.

Further, according to a further aspect of the present invention, the connecting direction of one of the first terminal portion and the second terminal portion which is smaller in width may be a direction defined by inclining the direction orthogonal to the one side of the rectangular display panel toward the one end of the one side of the rectangular display panel.

Further, according to a further aspect of the present invention, the connecting direction of the another of the first terminal portion and the second terminal portion may be a direction defined by inclining the direction orthogonal to the one side of the rectangular display panel toward another end of the one side of the rectangular display panel.

Further, according to a further aspect of the present invention, the display device may further include a transparent plate bonded to a surface of the rectangular touch panel on an opposite side with respect to the rectangular display panel.

According to the present invention, it becomes possible to provide the display device in which the test connectors are prevented from interfering with each other.

DETAILED DESCRIPTION OF THE INVENTION

Referring to the accompanying drawings, an exemplary embodiment of the present invention is described in detail below. Hereinafter, description is given of a case where the present invention is applied to a touch-panel attached liquid crystal display module for use in a mobile phone, which is a kind of display device.

The touch-panel attached liquid crystal display module according to the embodiment of the present invention includes a liquid crystal display panel having a printed circuit board attached thereto, a touch panel having a printed circuit board attached thereto, and a front window.

Figure 1:
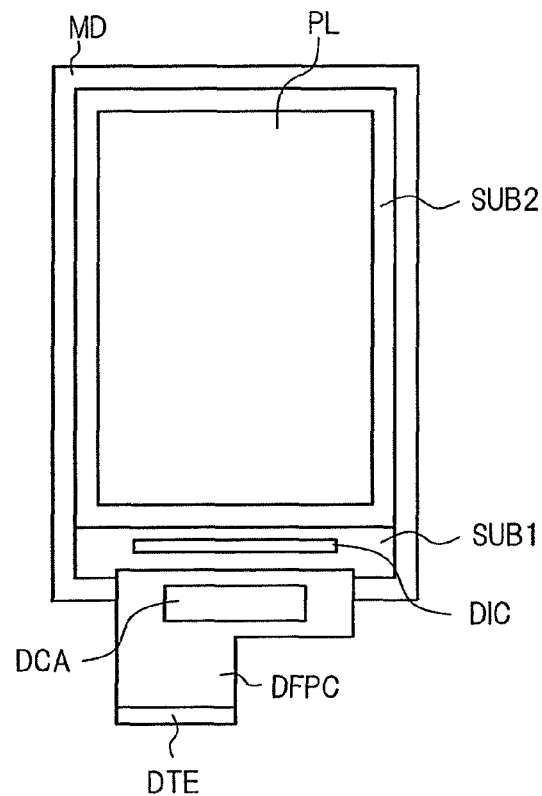
FIG. 1 is a plan view illustrating a liquid crystal display panel according to an embodiment of the present invention.

FIG. 1 is a plan view illustrating the liquid crystal display panel according to the embodiment of the present invention. The liquid crystal display panel includes a thin film transistor (TFT) array substrate SUB1 having a rectangular shape, a color filter substrate SUB2 having a rectangular shape, the color filter substrate SUB2 being provided so as to face the TFT array substrate SUB1, a polarizing plate PL provided above the color filter substrate SUB2, and a liquid crystal drive chip DIC disposed in a rectangular region of the TFT array substrate SUB1, the rectangular region being not covered with the color filter substrate SUB2. A resin mold MD is attached to a periphery of the TFT array substrate SUB1 of the liquid crystal display panel. A printed circuit board for display panel DFPC is attached along one side of the TFT array substrate SUB1 on the lower side of FIG. 1, the one side of the TFT array substrate SUB1 defining one side of the above-mentioned rectangular region. The printed circuit board for display panel DFPC extends in a direction orthogonal to the one side of the TFT array substrate SUB1. The printed circuit board for display panel DFPC includes an arrangement region for liquid crystal drive electronic component DCA, and various kinds of electronic components are arranged in this arrangement region. A terminal portion for display panel DTE is disposed on an end of the printed circuit board for display panel DFPC. The printed circuit board for display panel DFPC is a flexible printed circuit board. The printed circuit board for display panel DFPC and the TFT array substrate SUB1 are parallel with each other in a state of not being bent.

Figure 2:
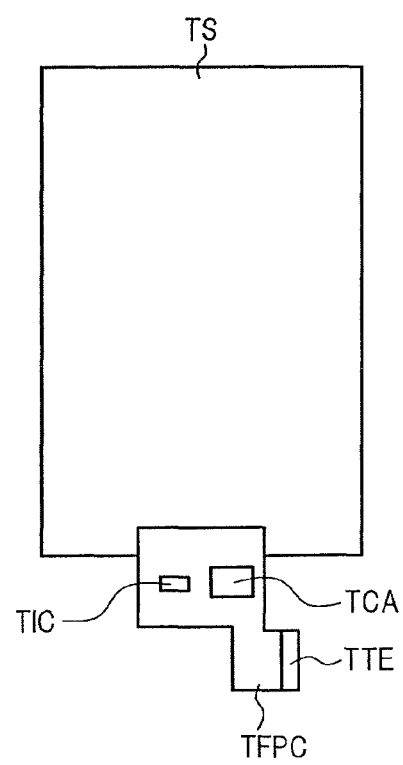
FIG. 2 is a plan view illustrating a touch panel according to the embodiment of the present invention.

FIG. 2 is a plan view illustrating the touch panel according to the embodiment of the present invention. The touch panel mainly includes a touch panel screen TS having a rectangular shape. In the touch panel, a printed circuit board for touch panel TFPC is attached along one side of the touch panel screen TS, and extends in a direction orthogonal to the one side thereof. A touch panel control chip TIC is disposed on the printed circuit board for touch panel TFPC. In addition to the touch panel control chip TIC, an arrangement region for touch panel electronic component TCA is provided in the printed circuit board for touch panel TFPC, and various kinds of electronic components are arranged in this arrangement region. A terminal portion for touch panel TTE is disposed on an end of the printed circuit board for touch panel TFPC. The printed circuit board for touch panel TFPC is a flexible printed circuit board. The printed circuit board for touch panel TFPC and the touch panel screen TS are parallel with each other in a state of not being bent.

Figure 3:
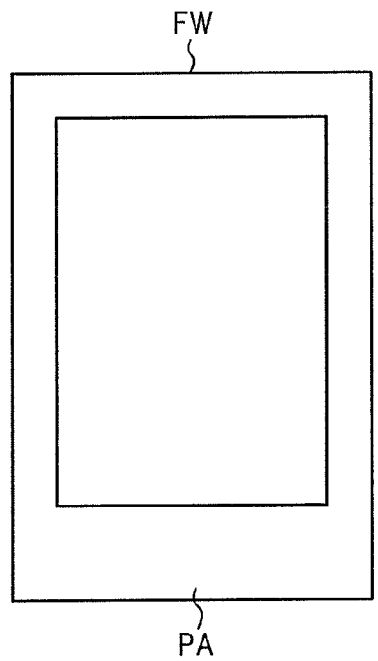
FIG. 3 is a plan view illustrating a front window according to the embodiment of the present invention.

FIG. 3 is a plan view illustrating a front window FW according to the embodiment of the present invention. The front window FW is formed by applying black printing to a part of a transparent rectangular plate, such as an acrylic plate. The black-printed part corresponds to a printed portion PA. The printed portion PA is designed so as not to overlap with a display region when overlapping with the display panel. In this embodiment, the front window FW is larger in horizontal width than the TFT array substrate SUB1 of the liquid crystal display panel. Note that a size of the front window FW may be changed depending on the structure of a case into which the touch-panel attached liquid crystal display module is mounted, such as a mobile phone.

Figure 4:
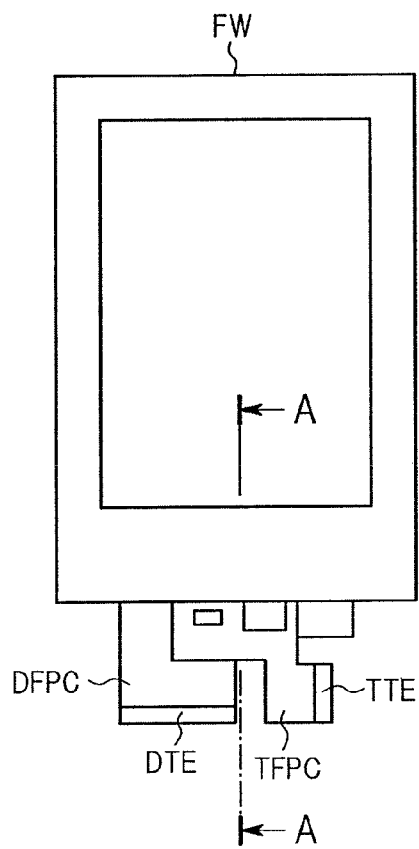
FIG. 4 is a plan view illustrating a touch-panel attached liquid crystal display module according to the embodiment of the present invention.

FIG. 4 is a plan view illustrating the touch-panel attached liquid crystal display module according to the embodiment of the present invention. The touch-panel attached liquid crystal display module illustrated in FIG. 4 is accomplished by overlapping with one another the liquid crystal display panel illustrated in FIG. 1, the touch panel illustrated in FIG. 2, and the front window FW illustrated in FIG. 3. The touch panel is placed above the liquid crystal display panel, and the front window FW is placed above the touch panel. A side of the TFT array substrate SUB1, the side being attached with the printed circuit board for display panel DFPC (hereinafter referred to as "display panel reference side"), and a side of the touch panel screen TS, the side being attached with the printed circuit board for touch panel TFPC (hereinafter referred to as "touch panel reference side"), are positioned on the same side with respect to the touch-panel attached liquid crystal display module. When viewed in plan, the printed circuit board for display panel DFPC is partially overlapped with the printed circuit board for touch panel TFPC.

Figure 5:
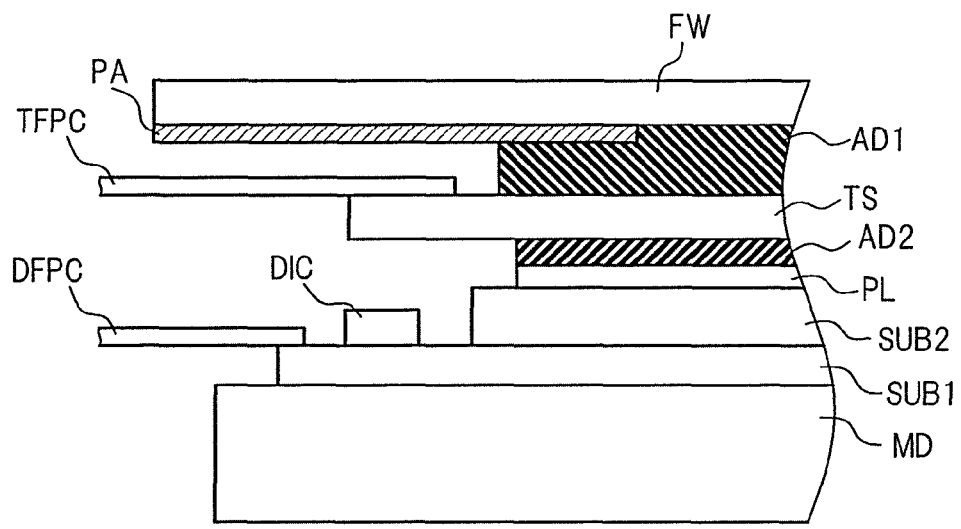
FIG. 5 is a cross-section taken along the line A-A of FIG. 4.

FIG. 5 is a cross-section taken along the line A-A of FIG. 4. The color filter substrate SUB2 is provided above the TFT array substrate SUB1 so as to face the TFT array substrate SUB1. The polarizing plate PL is disposed above the color filter substrate SUB2. The resin mold MD is disposed below the TFT array substrate SUB1. The liquid crystal display panel and the touch panel are bonded to each other by means of an adhesive layer AD2 which is provided between the polarizing plate PL and the touch panel screen TS provided thereabove. The touch panel and the front window FW are bonded to each other by means of an adhesive layer AD1 which is provided between the touch panel screen TS and the front window FW provided thereabove. The printed portion PA is provided on a part of a lower surface of the front window FW. A part of the printed portion PA is in contact with the adhesive layer AD1. Note that the front window FW and the touch panel are bonded to each other over their entire surfaces by means of the adhesive layer AD1, which makes it possible to achieve improved visibility with respect to light to be displayed in the touch-panel attached liquid crystal display module, and simplification of its structure.

As is apparent from FIG. 5, the touch panel screen TS and the TFT array substrate SUB1 are parallel with each other. The printed circuit board for display panel DFPC and the printed circuit board for touch panel TFPC which are respectively attached to the TFT array substrate SUB1 and the touch panel screen TS are also parallel with each other in the state of not being bent. Further, each side of the TFT array substrate SUB1 is parallel with each side of the touch panel screen TS adjacent to the corresponding side of the TFT array substrate SUB1. Accordingly, a direction in which the printed circuit board for display panel DFPC extends from the display panel reference side (corresponding to a direction orthogonal to the display panel reference side) and a direction in which the printed circuit board for touch panel TFPC extends from the touch panel reference side (corresponding to a direction orthogonal to the touch panel reference side) are the same direction (hereinafter referred to as "extending direction").

Figure 6:
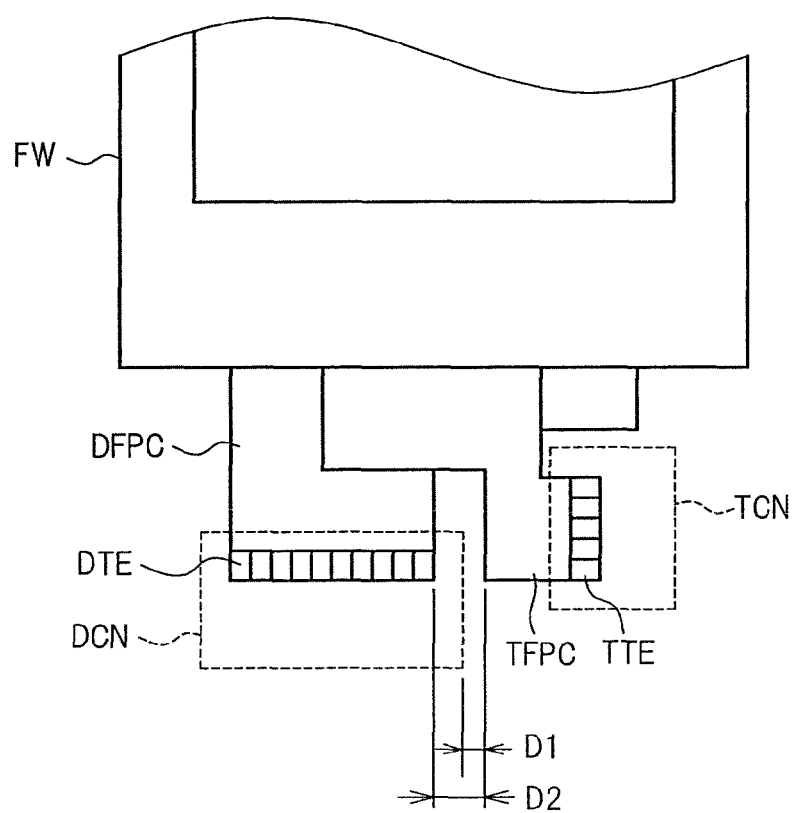
FIG. 6 is a plan view illustrating an example of configurations of terminal portions according to the embodiment of the present invention.

FIG. 6 is a plan view illustrating an enlarged part of the printed circuit boards and terminal portions of FIG. 4, and also illustrates an example of configurations of the terminal portions according to the embodiment of the present invention.

The printed circuit board for touch panel TFPC extends in the extending direction from the touch panel screen TS provided below the front window FW of FIG. 6. When viewed in plan, the printed circuit board for touch panel TFPC is crooked midway. The terminal portion for touch panel TTE is disposed on the crooked end of the printed circuit board for touch panel TFPC. Further, the printed circuit board for display panel DFPC extends in the extending direction from the TFT array substrate SUB1 provided below the touch panel screen TS. The terminal portion for display panel DTE is disposed on the end of the printed circuit board for display panel DFPC.

The terminal portion for display panel DTE and the terminal portion for touch panel TTE are provided so as to be separated horizontally from each other when viewed in plan. Specifically, the terminal portion for display panel DTE is provided on the left side of FIG. 6 while the terminal portion for touch panel TTE is provided on the right side of FIG. 6. Each of the terminal portions includes a plurality of terminals aligned in line on an edge of the printed circuit board. The terminals are each formed by exposing a part of wiring pattern of the printed circuit board. An alignment direction of the terminals included in the terminal portion for display panel DTE is parallel with the display panel reference side. A connecting direction of the terminal portion for display panel DTE corresponds to the extending direction. In this case, the connecting direction of the terminal portion refers to a direction in which the terminal portion is inserted into a connector, specifically, a direction which is orthogonal to the alignment direction of the terminals and is away from the printed circuit board on which the terminal portion is disposed. The connecting direction of the terminal portion for touch panel TTE is a direction inclined at 90° from the extending direction toward a right end of the touch panel reference side (or display panel reference side) when viewed in plan. Further, the terminal portion for touch panel TTE is smaller in width than the terminal portion for display panel DTE. Note that the width of the terminal portion corresponds to a length of the terminal portion in the alignment direction of the terminals.

When viewed in plan, the terminal portion for display panel DTE and the terminal portion for touch panel TTE are positioned between two lines extending from two specific parallel sides of the sides of the TFT array substrate SUB1 provided below the front window FW (hereinafter, a distance between the two parallel sides is referred to as an "installation width"). The two specific parallel sides correspond to two sides connecting with both ends of the display panel reference side. The reason why the terminal portion for display panel DTE and the terminal portion for touch panel TTE are arranged within the installation width is that most of the installation width is accounted for the display panel in the case of a mobile phone or the like and hence the terminal portions interfere with an exterior panel or the like of the mobile phone if arranged over the installation width. Note that when incorporated into a mobile phone or the like, both of the printed circuit board for display panel DFPC and the printed circuit board for touch panel TFPC are bent so as to respectively connect the terminal portion DTE and the terminal portion TTE to connectors provided on other substrates.

In FIG. 6, a test connector DCN to be connected to the terminal portion for display panel DTE and a test connector TCN to be connected to the terminal portion for touch panel TTE are respectively illustrated by broken lines. Those test connectors DCN and TCN do not interfere with each other because positions thereof are physically separated.

The reason why those test connectors DCN and TCN do not interfere with each other becomes clear when those connectors are projected onto a side (hereinafter referred to as projection side), which is parallel with the display panel reference side when viewed from the extending direction. This is because, if those two test connectors DCN and TCN projected onto the projection side do not overlap with each other, the test connectors DCN and TCN do not interfere with each other. When the test connector DCN provided on the left side, to which the terminal portion for display panel DTE is to be connected, is projected onto the projection side, a projected right end of the test connector DCN corresponds to a right end of a side of the test connector DCN on a base side or connecting direction side of the terminal portion for display panel DTE. On the other hand, because a connecting direction of the test connector TCN provided on the right side is rotated by 90° toward the display panel reference side with respect to the extending direction, a left end of the test connector TCN when projected onto the projection side corresponds to a side of the test connector TCN on a base side of the terminal portion for touch panel TTE. Further, the alignment direction of the terminals included in the terminal portion for touch panel TTE corresponds to the extending direction, and hence a length of the terminal portion for touch panel TTE when projected onto the projection side is reduced. This means that it is possible to bring a position of the terminal portion for touch panel TTE into a right end of the installation width. As a result, the interference between the test connectors DCN and TCN may be eliminated.

In this example, as described above, the test connectors DCN and TCN do not interfere with each other. In the example of FIG. 6, in order to prevent the test connector DCN and the printed circuit board for touch panel TFPC from interfering with each other, a clearance D1 is additionally secured therebetween. Design only needs to be made taking into consideration that a clearance D2 is secured between the printed circuit board for display panel DFPC and the printed circuit board for touch panel TFPC.

In addition, because the alignment direction of the terminals included in the terminal portion for touch panel TTE corresponds to the extending direction, the printed circuit board for touch panel TFPC needs to extend from the front window FW by a length or more of the side on the base side of the test connector DCN when viewed in plan. In the example of FIG. 6, because the alignment direction of the terminals included in the terminal portion for touch panel TTE having the smaller width corresponds to the extending direction, the length of the printed circuit board may be reduced to be even smaller compared with the case where the alignment direction of the terminals included in the terminal portion for display panel DTE corresponds to the extending direction. This makes it possible to secure the larger number of flexible printed circuit boards capable of being produced from one printed circuit board material. Note that the same effect as described above can be obtained even in a case where a horizontal positional relation between the terminal portion for display panel DTE and the terminal portion for touch panel TTE is reversed.

Figure 7:
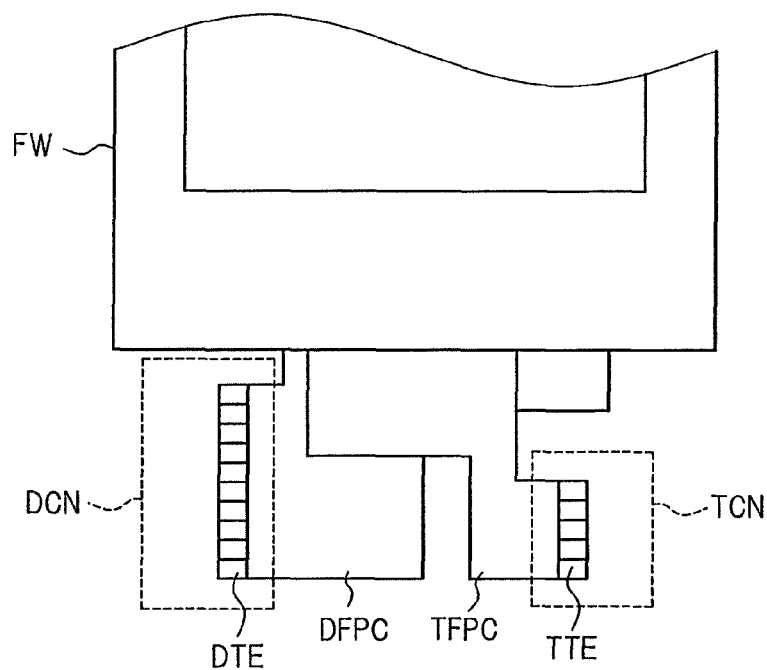
FIG. 7 is a plan view illustrating another example of the configurations of the terminal portions according to the embodiment of the present invention.

FIG. 7 is a view illustrating another example of the configurations of the terminal portions according to the embodiment of the present invention. A relation between the printed circuit board for touch panel TFPC and the touch panel screen TS provided below the front window FW and a relation between the printed circuit board for display panel DFPC and the TFT array substrate SUB1 provided below the touch panel screen TS are identical with those of the example of FIG. 6. When viewed in plan, the printed circuit board for display panel DFPC is crooked midway. The terminal portion for display panel DTE is disposed on the crooked end of the printed circuit board for display panel DFPC. The printed circuit board for touch panel TFPC is also crooked midway when viewed in plan. The terminal portion for touch panel TTE is disposed on the crooked end of the printed circuit board for touch panel TFPC.

The terminal portion for display panel DTE and the terminal portion for touch panel TTE are provided so as to be separated horizontally from each other when viewed in plan. Specifically, the terminal portion for display panel DTE is provided on the left side of FIG. 7 while the terminal portion for touch panel TTE is provided on the right side of FIG. 7. The connecting direction of the terminal portion for display panel DTE is a direction inclined at 90° from the extending direction toward a left end of the display panel reference side when viewed in plan. The connecting direction of the terminal portion for touch panel TTE is a direction inclined at 90° from the extending direction toward the right end of the touch panel reference side (or display panel reference side) when viewed in plan. Further, the terminal portion for touch panel TTE is smaller in width than the terminal portion for display panel DTE. As in the example of FIG. 6, the terminal portion for touch panel TTE and the terminal portion for display panel DTE are arranged within the installation width when viewed in plan.

When the test connector DCN provided on the left side, to which the terminal portion for display panel DTE is to be connected, is projected onto the projection side, a projected right end of the test connector DCN corresponds to the side of the test connector DCN on the base side of the terminal portion for display panel DTE. On the other hand, a left end of the test connector TCN when projected onto the projection side corresponds to the side of the test connector TCN on the base side of the terminal portion for touch panel TTE. Further, because the alignment direction of the terminals included in the terminal portion for display panel DTE and the alignment direction of the terminals included in the terminal portion for touch panel TTE correspond to the extending direction, the length of the terminal portion for display panel DTE and the length of the terminal portion for touch panel TTE when projected onto the projection side are reduced. This means that it is possible to bring a position of the terminal portion for display panel DTE into a left end of the installation width and a position of the terminal portion for touch panel TTE into a right end thereof. As a result, the interference between the test connectors DCN and TCN may be eliminated.

Figure 8:
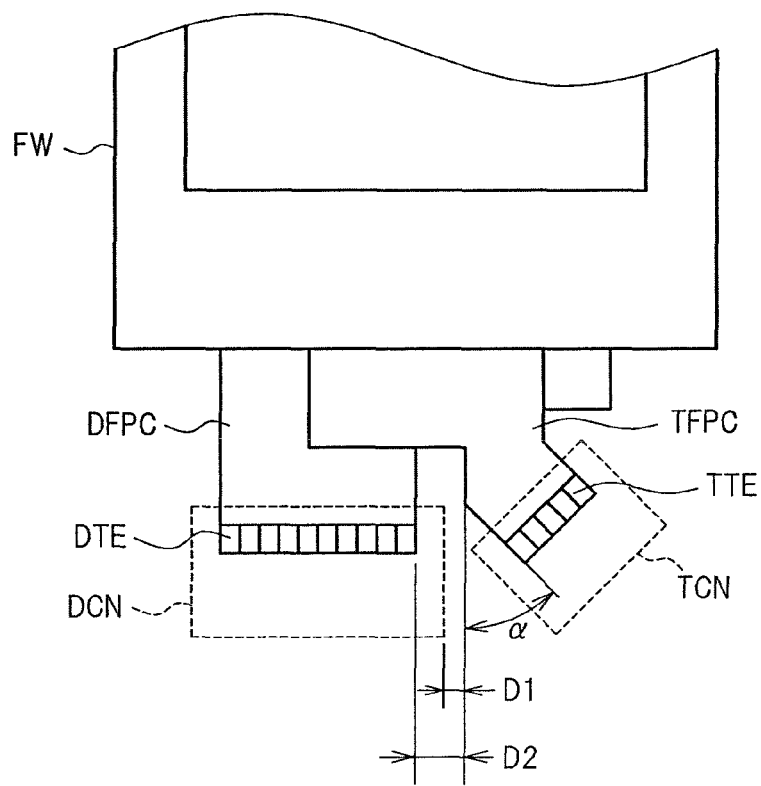
FIG. 8 is a plan view illustrating still another example of the configurations of the terminal portions according to the embodiment of the present invention.
Figure 9:
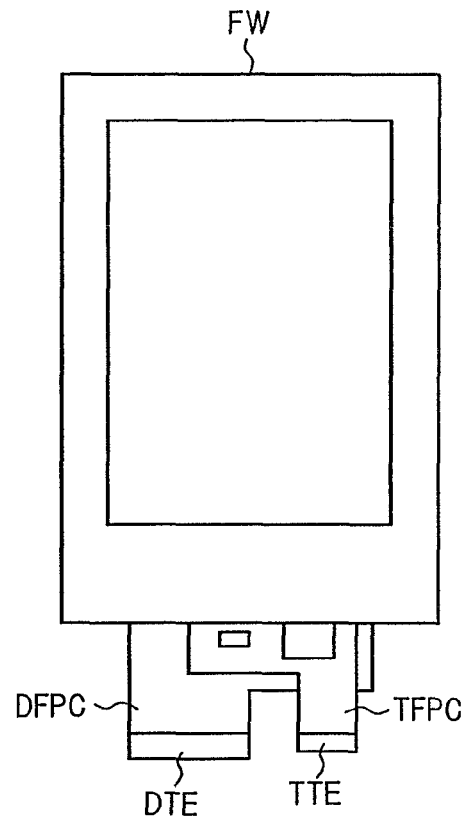
FIG. 9 is a plan view illustrating an example of a touch-panel attached display module.
Figure 10:
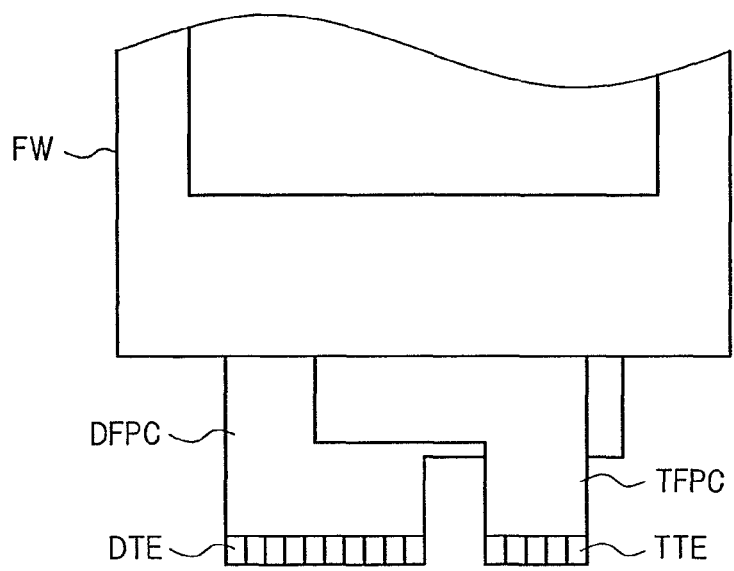
FIG. 10 is a partial enlarged view of a vicinity of printed circuit boards illustrated in FIG. 9.
Figure 11:
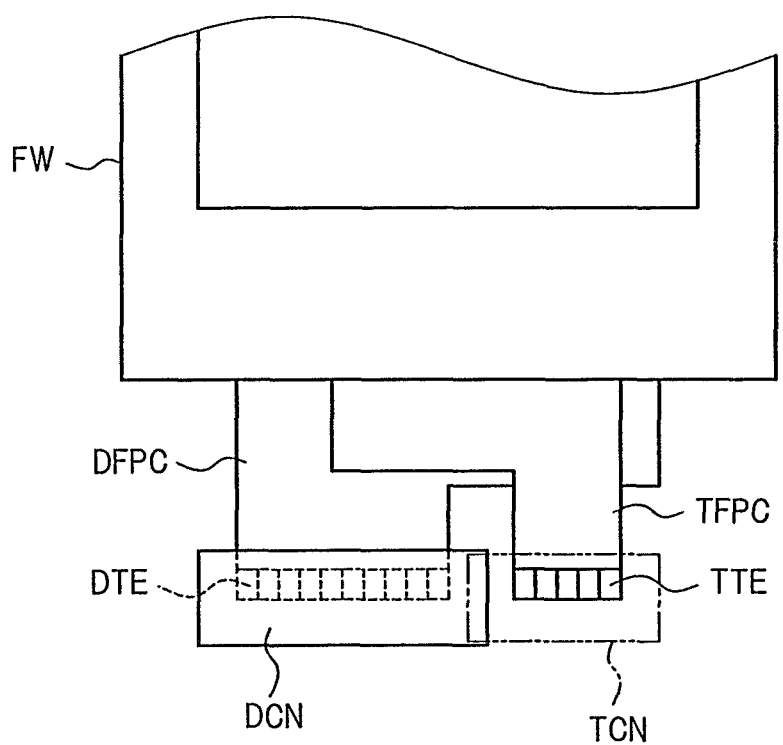
FIG. 11 is a view illustrating a positional relation between test connectors in a case where the test connectors are to be connected to terminal portions illustrated in FIG. 10.

FIG. 8 is a view illustrating still another example of the configurations of the terminal portions according to the embodiment of the present invention. A relation between the printed circuit board for touch panel TFPC and the touch panel screen TS provided below the front window FW and a relation between the printed circuit board for display panel DFPC and the TFT array substrate SUB1 provided below the touch panel screen TS are identical with those of the example of FIG. 6. The printed circuit board for display panel DFPC extends in the extending direction. The terminal portion for display panel DTE is disposed on the end of the printed circuit board for display panel DFPC. The printed circuit board for touch panel TFPC is crooked midway when viewed in plan. The terminal portion for touch panel TTE is disposed on the crooked end of the printed circuit board for touch panel TFPC.

The terminal portion for display panel DTE and the terminal portion for touch panel TTE are provided so as to be separated horizontally from each other when viewed in plan. Specifically, the terminal portion for display panel DTE is provided on the left side of FIG. 8 while the terminal portion for touch panel TTE is provided on the right side of FIG. 8. The connecting direction of the terminal portion for display panel DTE is the extending direction. The connecting direction of the terminal portion for touch panel TTE is a direction inclined at $\alpha°$ ($\alpha$ is a positive value less than 90°, and is 45° in FIG. 8) from the extending direction toward the right end of the touch panel reference side (or display panel reference side) when viewed in plan. Further, the terminal portion for touch panel TTE is smaller in width than the terminal portion for display panel DTE. As in the example of FIG. 6, the terminal portion for touch panel TTE and the terminal portion for display panel DTE are arranged within the installation width when viewed in plan.

When the test connector DCN provided on the left side, to which the terminal portion for display panel DTE is to be connected, is projected onto the projection side, a projected right end of the test connector DCN corresponds to a right end of the side of the test connector DCN on the base side or connecting direction side of the terminal portion for display panel DTE. On the other hand, a left end of the test connector TCN provided on the right side when projected onto the projection side corresponds to a left end of the side of the test connector TCN on the base side of the terminal portion for touch panel TTE. In this case, because the alignment direction of the terminals included in the terminal portion for touch panel TTE is inclined at $\alpha°$, the length of the terminal portion for touch panel TTE when projected onto the projection side is determined as "the width of the terminal portion for touch panel TTE"×"cos($\alpha$)" to be reduced compared with the case where the connecting direction of the terminal portion for touch panel TTE is made the same as the extending direction.

This means that it is possible to bring a position of the terminal portion for touch panel TTE into a right end of the installation width. As a result, the interference between the test connectors DCN and TCN may be eliminated. Besides, the length of the terminal portion for touch panel TTE in the extending direction is smaller than the cases of FIG. 6 and FIG. 7, and accordingly the length of the printed circuit board may be reduced to be even smaller, which makes it possible to secure the larger number of flexible printed circuit boards capable of being produced from one printed circuit board material.

Note that as in the example of FIG. 6, in order to prevent the test connector DCN and the printed circuit board for touch panel TFPC from interfering with each other, a clearance D1 is additionally secured therebetween. Design only needs to be made taking into consideration that a clearance D2 is secured between the printed circuit board for display panel DFPC and the printed circuit board for touch panel TFPC.

As has been described above with reference to the examples, interference between the test connectors DCN and TCN may be suppressed. Further, because no problem arises even when the test connectors DCN and TCN are large in size, it becomes possible to employ general-purpose FPC connectors. As a result, it also becomes possible to perform test jig maintenance with more ease. Note that as another countermeasure against the interference between the test connectors, there may be conceived an idea of eliminating the interference by lengthening one of the terminal portions in the extending direction so as to extend off a housing portion of a connector corresponding to another one of the terminal portions. However, even compared with the idea described above, the present invention has an advantage of securing the larger number of flexible printed circuit boards capable of being produced from one printed circuit board material, to thereby suppress lowering of yield. Besides, the present invention has another advantage that the lengths of the flexible printed circuit boards in the extending direction are short to be suitable for reduction in size of a device.

While there have been described what are at present considered to be certain embodiments of the invention, it will be understood that various modifications may be made thereto, and it is intended that the appended claims cover all such modifications as fall within the true spirit and scope of the invention.

In the embodiment of the present invention, the case of the touch-panel attached liquid crystal display module for use in a mobile phone has been described. However, the present invention is not limited thereto. It should be understood that the present invention is applicable to, for example, a case where other display panel including an organic electroluminescence device is used instead of the liquid crystal display panel, and any use other than the mobile phone.

What is claimed is:

1. A display device, comprising:
   a display panel;
   a first film-like printed circuit board including a first terminal portion to which a connector is to be connected, the first film-like printed circuit board extending without folding from one side of the display panel in a direction away from the display panel;
   a touch panel provided so as to be opposed to the display panel; and
   a second film-like printed circuit board including a second terminal portion to which a connector is to be connected, the second film-like printed circuit board extending without folding from one side of the touch panel in the direction away from the display panel, the one side of the touch panel corresponding to a side parallel with and adjacent to the one side of the display panel;
   wherein the first terminal portion and the second terminal portion are provided so that a connecting direction of one of the first terminal portion and the second terminal portion is different from a connecting direction of another of the first terminal portion and the second terminal portion; and
   wherein the first terminal portion of the first film-like printed circuit board does not overlap with the second film-like printed circuit board, and the second terminal portion of the second film-like printed circuit board does not overlap with the first film-like printed circuit board.

2. A display device according to claim 1, wherein the first terminal portion and the second terminal portion are positioned between two lines extending from two parallel sides connecting with both ends of the one side of the display panel.

3. A display device according to claim 1, wherein one circuit board of the first film-like printed circuit board and the second film-like printed circuit board extends to a direction away from the display panel or the touch panel, and the direction of the one circuit board changes in some area away from a root of the one circuit board without folding so that the connecting direction of the terminal portion of the one circuit board differs from the direction away from the display panel or the touch panel.

4. A display device according to claim 1, further comprising a transparent plate bonded to a surface of the touch panel on an opposite side with respect to the display panel.

* * * * *